US012777681B2

(12) United States Patent
Jhan et al.

(10) Patent No.: US 12,777,681 B2
(45) Date of Patent: Oct. 27, 2026

(54) INTEGRATED CIRCUIT DEVICE AND MANUFACTURING METHOD THEREOF

(71) Applicant: TAIWAN SEMICONDUCTOR MANUFACTURING COMPANY, LTD., Hsinchu (TW)

(72) Inventors: Yi-Ruei Jhan, Keelung City (TW); Kuan-Ting Pan, Taipei City (TW); Wei Ting Wang, Taipei City (TW); Shi Ning Ju, Hsinchu City (TW); Kuo-Cheng Chiang, Hsinchu County (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 728 days.

(21) Appl. No.: 17/850,845

(22) Filed: Jun. 27, 2022

(65) Prior Publication Data

US 2023/0420532 A1 Dec. 28, 2023

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 84/01*** | (2026.01) |
| ***H10D 84/03*** | (2025.01) |
| ***H10D 84/83*** | (2025.01) |

(52) U.S. Cl.
CPC ....... *H10D 30/6735* (2025.01); *H10D 30/014* (2025.01); *H10D 30/43* (2025.01); *H10D 30/6757* (2025.01); *H10D 62/115* (2025.01); *H10D 62/121* (2025.01); *H10D 84/0151* (2025.01); *H10D 84/0158* (2025.01); *H10D 84/038* (2025.01); *H10D 84/834* (2025.01)

(58) Field of Classification Search
None
See application file for complete search history.

(56) References Cited

U.S. PATENT DOCUMENTS

2017/0154973 A1* 6/2017 Ching ................ H10D 30/6757
2019/0067120 A1* 2/2019 Ching .................. H10D 30/611
2019/0165094 A1* 5/2019 Ching .................. H10D 84/834
2020/0006577 A1* 1/2020 Ching ................. H01L 21/0262

* cited by examiner

*Primary Examiner* — Julio J Maldonado
*Assistant Examiner* — Pinaki Das
(74) *Attorney, Agent, or Firm* — Maschoff Brennan

(57) ABSTRACT

A method of manufacturing an integrated circuit device is provided. The method includes forming a semiconductor fin over a semiconductor substrate; forming an isolation structure surrounding the semiconductor fin; etching a trench in the semiconductor fin; forming a dielectric fin in the trench; after forming the dielectric fin, recessing a top surface of the isolation structure, such that the dielectric fin and the semiconductor fin protrude from the recessed top surface of the isolation structure; and forming a first metal gate structure and a second metal gate structure over the dielectric fin and the semiconductor fin, respectively.

20 Claims, 23 Drawing Sheets

INTEGRATED CIRCUIT DEVICE AND MANUFACTURING METHOD THEREOF

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a gate-all-around (GAA) FET. In a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
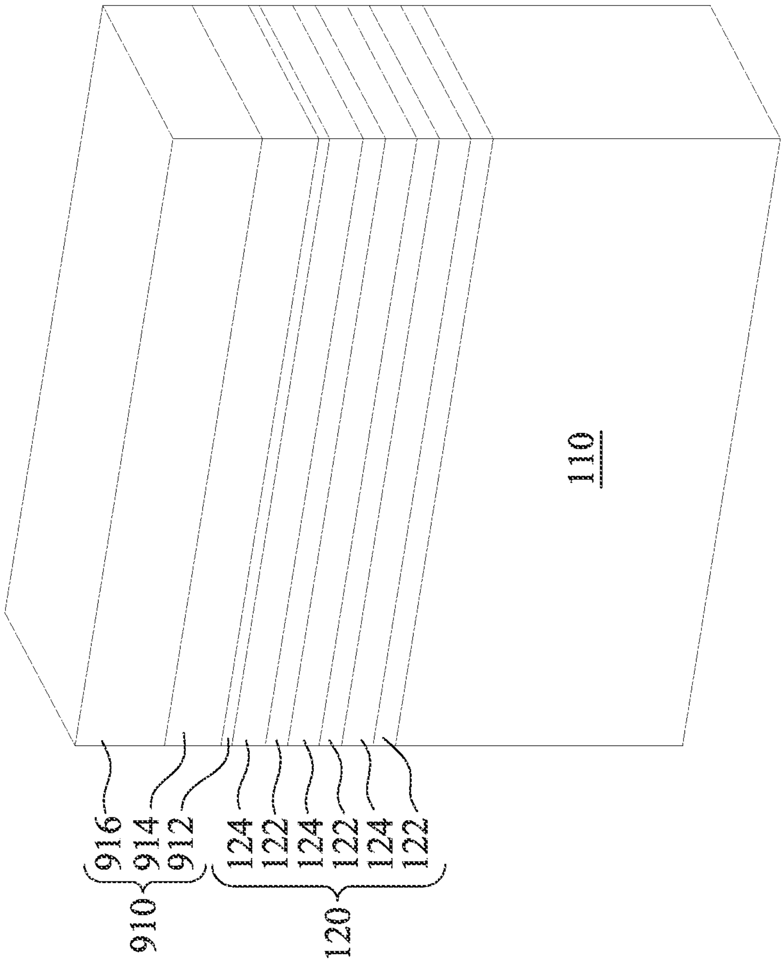
FIGS. 1-12 illustrate a method of manufacturing an integrated circuit device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Dielectric fin structures at ends of oxide defined (OD) regions can be used in integrated circuits for poly line collapse reduction. The integrated circuit device with the dielectric fin structures and method of fabricating the same are provided in accordance with various embodiments. The intermediate stages of forming the integrated circuit device are illustrated. The variations and the operation of the embodiments are discussed. Throughout the various views and illustrative embodiments, like reference numbers are used to designate like elements.

The dielectric fin structures may be compatible to the process flow of transistor devices, such as multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a gate all around (GAA) device or a nanosheet device having gate material disposed on at least four sides of at least one channel of the device. The channel region may be referred to as a "nanowire," which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

FIGS. 1-12 illustrate a method of manufacturing an integrated circuit device at various stages in accordance with some embodiments. FIGS. 2A, 3A, 6A, 7A, 9A, 10A, and 11A are top views of the integrated circuit device at various stages in accordance with some embodiments. FIGS. 1, 2B, 3B, 4-5, 6B, 7B, 8A, 9B, 10B, 11B, and 12 are perspective views of a portion of the integrated circuit device (e.g., the portion B in FIGS. 2A, 3A, 6A, 7A, 9A, 10A, and 11A) at various manufacturing stages in accordance with some embodiments. FIGS. 8B, 9C, and 11C are cross-sectional views taken along line Z1-Z1 in FIGS. 8A, 9B, and 11B. FIGS. 9D and 11D are cross-sectional views taken along line Z2-Z2 in FIGS. 9B and 11B. FIG. 11E is a cross-sectional view taken along line Z3-Z3 in FIG. 11B. It is understood that additional steps may be provided before, during, and after the steps shown in FIGS. 1-12, and some of the steps described below can be replaced or eliminated for additional embodiments of the method. The order of the operations/processes may be interchangeable.

As with the other method embodiments and exemplary devices discussed herein, it is understood that parts of the integrated circuit structure may be fabricated by a CMOS technology process flow, and thus some processes are only briefly described herein. Further, the exemplary integrated circuit structure may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the concepts of the present disclosure. In some embodiments, the exemplary integrated circuit structure includes a plurality of semiconductor devices (e.g., transistors), including PFETs, NFETs, etc., which may be interconnected.

FIG. 1 illustrates a perspective view of an initial structure. The initial structure includes a substrate 110. The substrate 110 may be a bulk silicon substrate. Alternatively, the substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 110 also include a silicon-on-insulator (SOI) substrate. SOI substrates are fabricated using separation by implantation of oxygen (SIMOX), wafer bonding, and/or other suitable methods.

An epitaxial stack 120 may be formed over the substrate 110. The epitaxial stack 120 may include epitaxial layers 122 of a first composition interposed by epitaxial layers 124 of a second composition. The first and second compositions can be different. In some embodiments, the epitaxial layers 122 are SiGe, and the epitaxial layers 124 are silicon (Si). However, other embodiments are possible including those that provide for a first composition and a second composition having different oxidation rates and/or etch selectivity. In some embodiments, the epitaxial layers 122 include SiGe and where the epitaxial layers 124 include Si, the Si oxidation rate of the epitaxial layers 124 is less than the SiGe oxidation rate of the epitaxial layers 122.

The epitaxial layers 124 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 124 to define a channel or channels of a device is further discussed below.

It is noted that four layers of the epitaxial layers 122 and three layers of the epitaxial layers 124 are alternately arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124 is between 2 and 10.

In some embodiments, each epitaxial layer 122 has a thickness ranging from about 1 nanometers (nm) to about 10 nm, but other ranges are within the scope of various embodiments of the present disclosure. The epitaxial layers 122 may be substantially uniform in thickness. In some embodiments, each epitaxial layer 124 has a thickness ranging from about 1 nm to about 10 nm, but other ranges are within the scope of various embodiments of the present disclosure. In some embodiments, the epitaxial layers 124 of the stack are substantially uniform in thickness. As described in more detail below, the epitaxial layers 124 may serve as channel region(s) for a subsequently-formed multi-gate device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 122 may also be referred to as sacrificial layers, and epitaxial layers 124 may also be referred to as channel layers.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124 include the same material as the substrate 110. In some embodiments, the epitaxially grown layers 122 and 124 include a different material than the substrate 110. As stated above, in at least some examples, the epitaxial layers 122 include an epitaxially grown silicon germanium (SiGe) layer and the epitaxial layers 124 include an epitaxially grown silicon (Si) layer. Alternatively, in some embodiments, either of the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124 may be chosen based on providing differing oxidation and/or etching selectivity properties. In some embodiments, the epitaxial layers 122 and 124 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

A hard mask (HM) layer 910 may be formed over the epitaxial stack 120. In some embodiments, the HM layer 910 includes a pad oxide layer 912 (e.g., $SiO_2$), a nitride mask layer 914 (e.g., $Si_3N_4$) formed over the oxide layer 912, and an oxide mask layer 916 (e.g., $SiO_2$) formed over the nitride layer 914. The pad oxide layer 912 may act as an adhesion layer between the epitaxial stack 120 and the nitride mask layer 914, and may act as an etch stop layer for etching the nitride mask layer 914. In some examples, the pad oxide layer 912 includes thermally grown oxide, chemical vapor deposition (CVD)-deposited oxide, and/or atomic layer deposition (ALD)-deposited oxide. In some embodiments, the nitride mask layer 914 is deposited on the pad oxide layer 912 by CVD and/or other suitable techniques. In some embodiments, the oxide mask layer 916 is deposited on the nitride mask layer 914 by CVD and/or other suitable techniques.

Figure 2A:
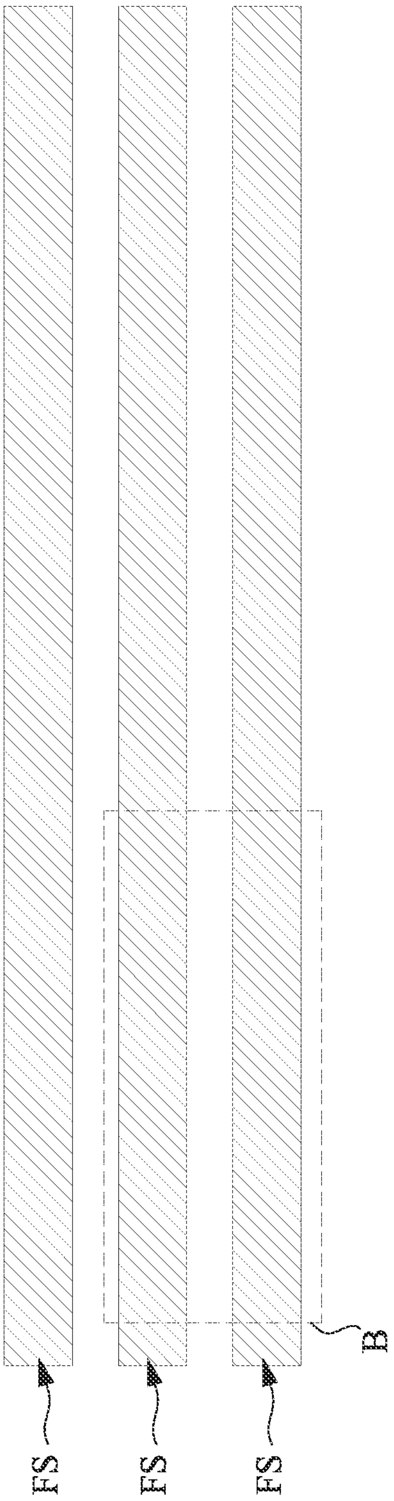
Figure 2B:
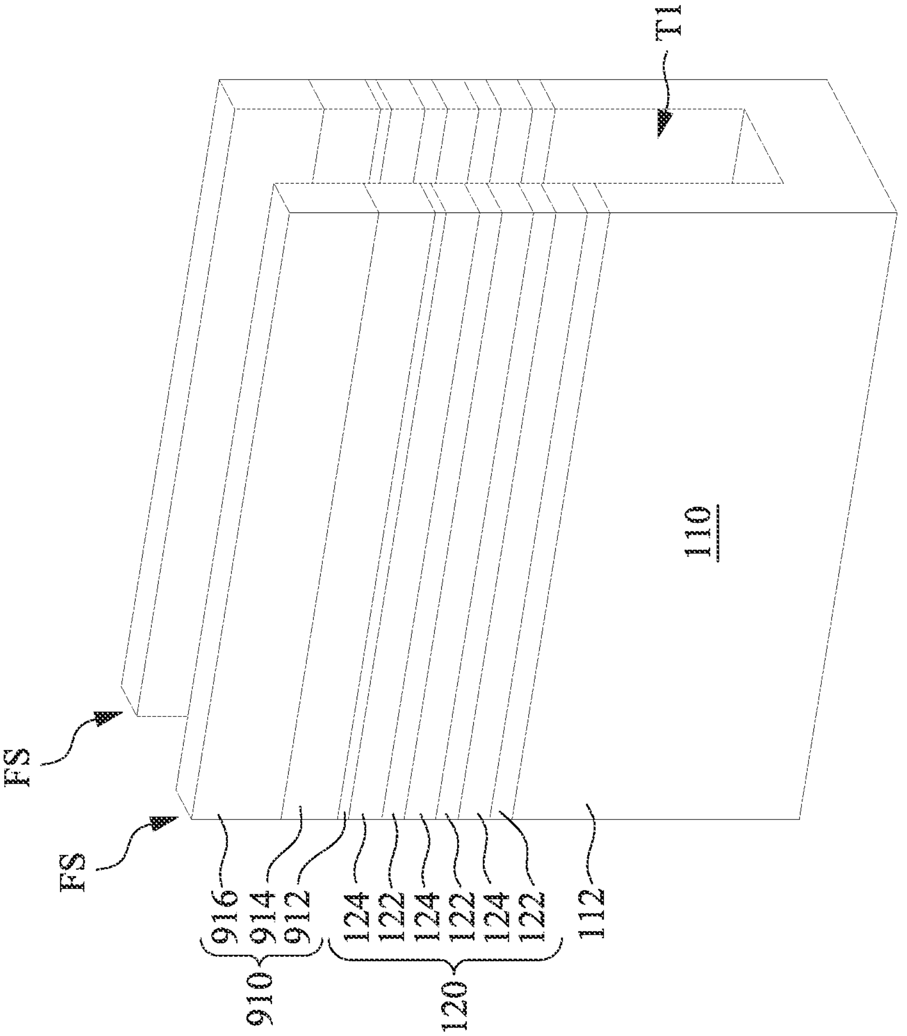

FIGS. 2A and 2B illustrate a top view and a perspective view of formation of semiconductor fins FS extending from the substrate 110. In various embodiments, each of the fins FS includes a portion 112 of the substrate 110 and portions of each of the epitaxial layers of the epitaxial stack including epitaxial layers 122 and 124. The fins FS may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins FS by etching initial epitaxial stack 120 (illustrated in FIG. 1). The etching process can include dry etching, wet etching, reactive ion etching (RIE), and/or other suitable processes.

The fins FS may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-100 nm. The patterned mask may then be used to protect regions of the substrate 110, and layers formed thereupon, while an etch process forms trenches T1 in unprotected regions through the HM layer 910, through the epitaxial stack 120, and into the substrate 110, thereby leaving the plurality of extending fins FS. The trenches T1 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins FS.

Figure 3A:
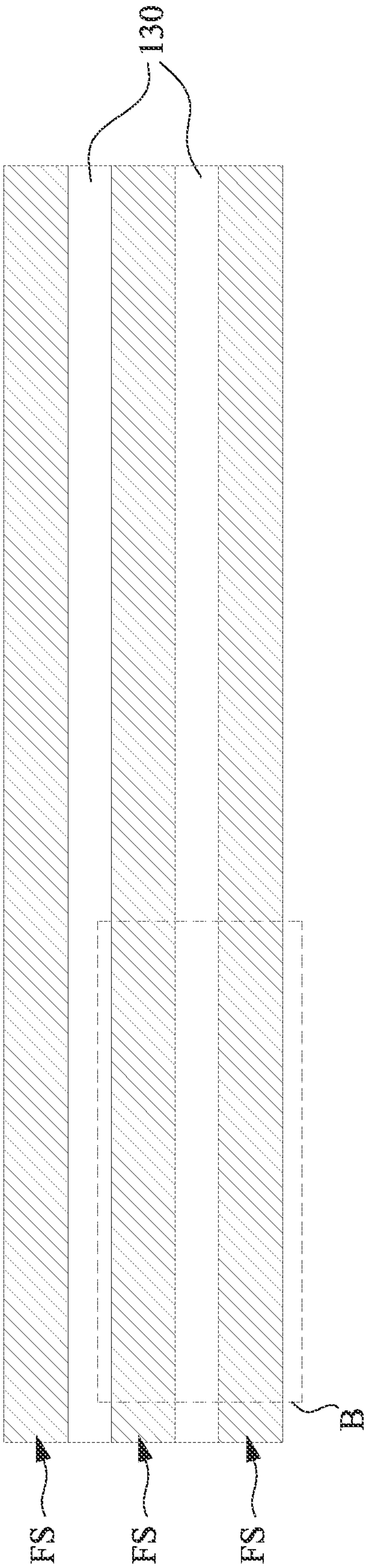
Figure 3B:
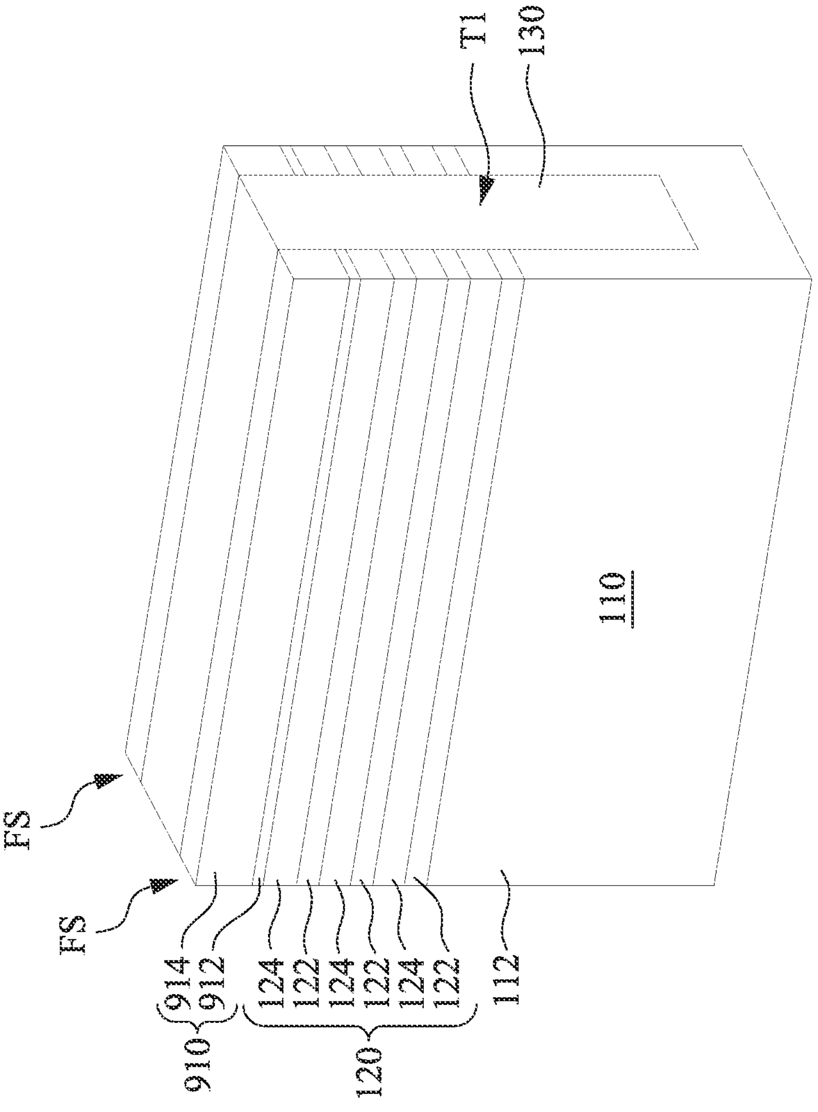

FIGS. 3A and 3B illustrate a top view and a perspective view of formation of an isolation structure 130 in the trenches T1 between the fins FS. By way of example and not limitation, a dielectric layer is first deposited over the substrate 110, filling the trenches T1 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable processes. In some embodiments, after deposition of the dielectric layer, the integrated circuit structure may be annealed, for example, to improve the quality of the dielectric layer. In some embodiments, the dielectric layer (and subsequently formed isolation structure 130) may include a multi-layer structure, for example, having one or more liner layers. In the context, the isolation structure 130 may define oxide defined (OD) regions (e.g., fins FS).

In some embodiments, after the deposition of the dielectric layer, the deposited dielectric material is thinned and planarized, for example by a chemical mechanical polishing (CMP) process. In some embodiments, the nitride mask layer 914 of the HM layer 910 functions as a CMP stop layer, so that the top surface of the isolation structure 130 may be substantially coplanar with the top surface of the nitride mask layer 914 after the CMP process is completed.

Figure 4:
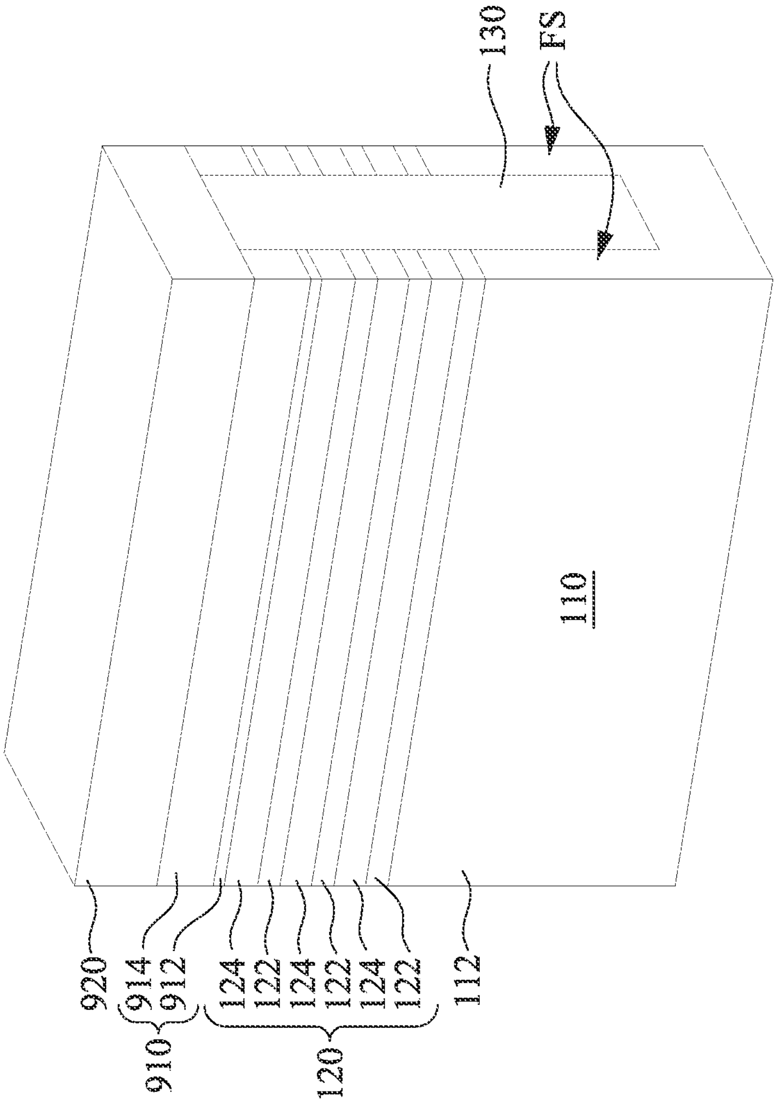

FIG. 4 illustrate a perspective view of formation of a mask layer 920 over the structure of FIG. 3B. The mask layer 920 may include a dielectric material different from that of the nitride mask layer 914 and that of the isolation structure 130. For example, the nitride mask layer 914 includes $Si_3N_4$, the isolation structure 130 includes $SiO_2$, and the mask layer 920 may include SiOCN.

Figure 5:
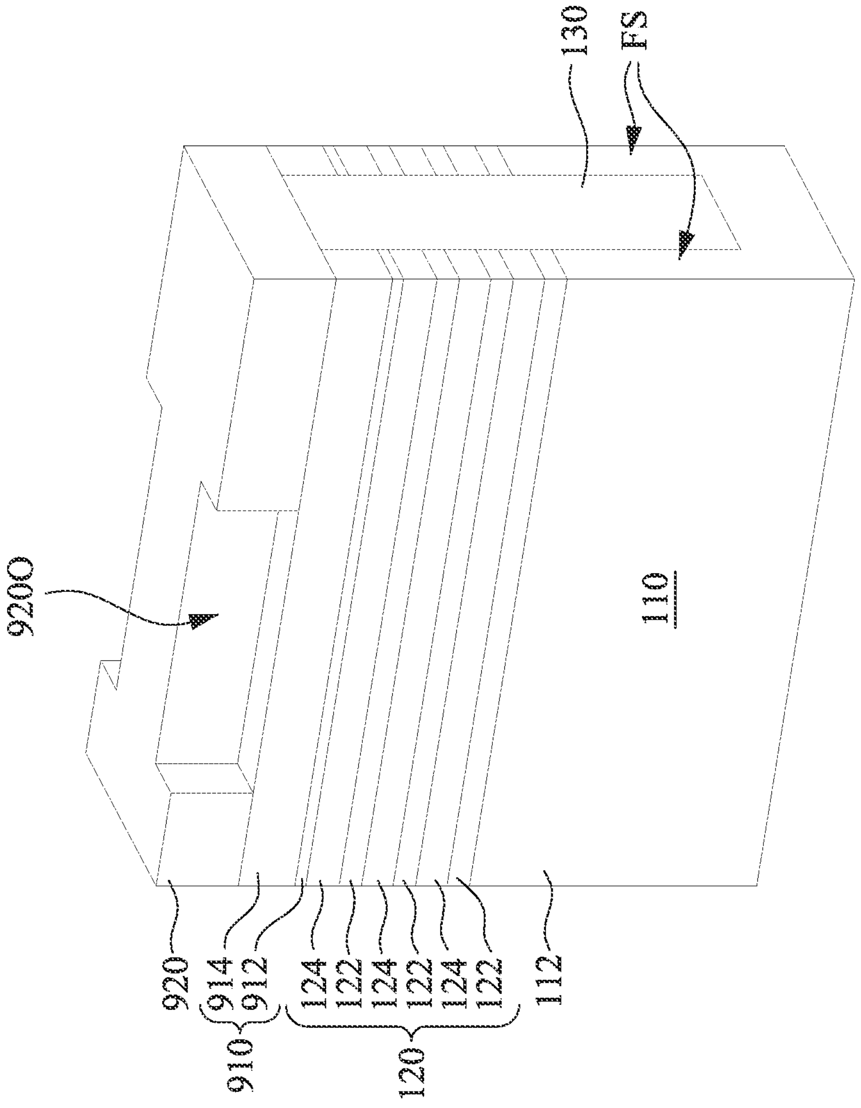

FIG. 5 illustrate a perspective view of patterning the mask layer 920. The mask layer 920 may be patterned using suitable processes including photolithography and etch processes. The photolithography process may include forming a photoresist layer (not shown) over the mask layer 920, exposing the photoresist to a pattern (e.g., an OD-end pattern or a cut OD pattern), performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process. The patterned mask may then be used to protect regions of the mask layer 920, while an etch process forms openings 9200 in unprotected regions through the mask layer 920. The openings 9200 in the mask layer 920 may expose the underlying nitride mask layer 914. The etch process may show etch selectivity between the mask layer 920 and the nitride mask layer 914 of the HM layer 910. The nitride mask layer 914 may serve as an etch stop layer during the etch process. For example, the etch process etches the mask layer 920 at a faster rate than the etch process etches the nitride mask layer 914.

Figure 6A:
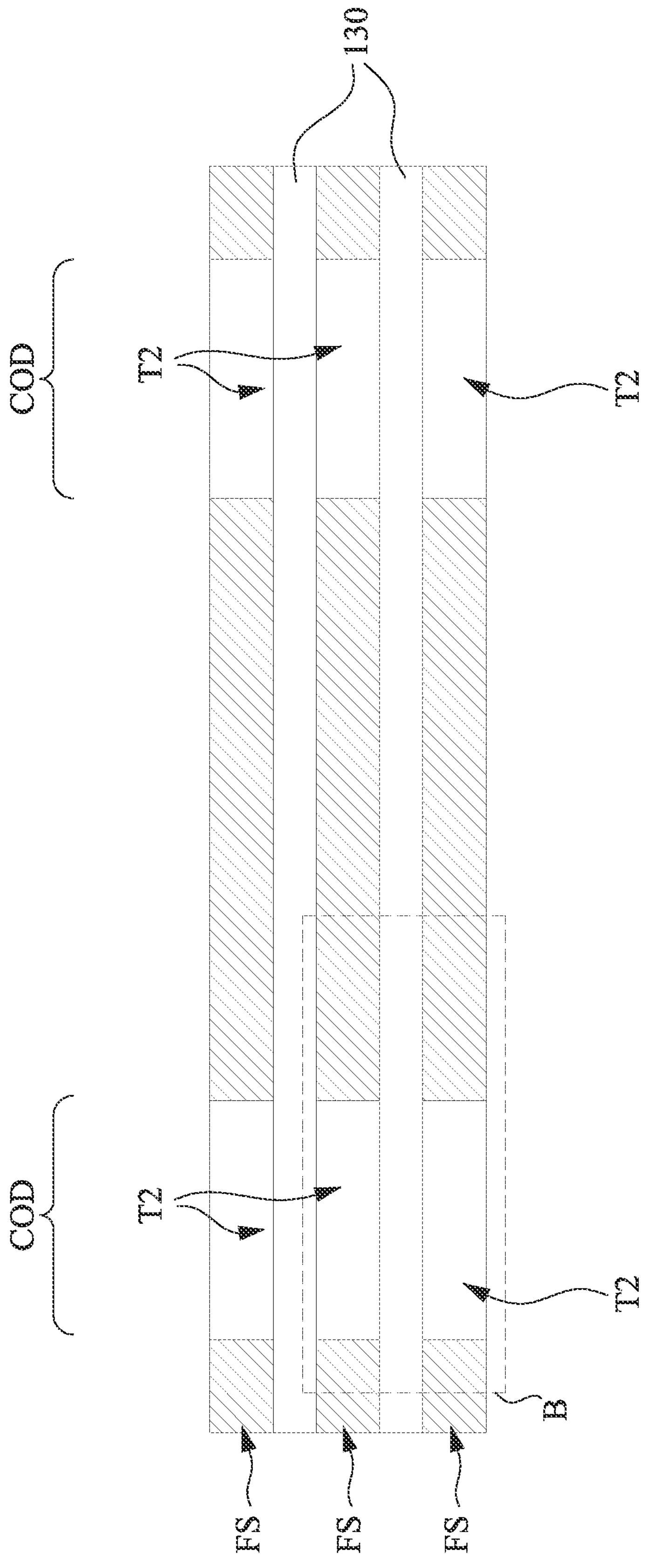
Figure 6B:
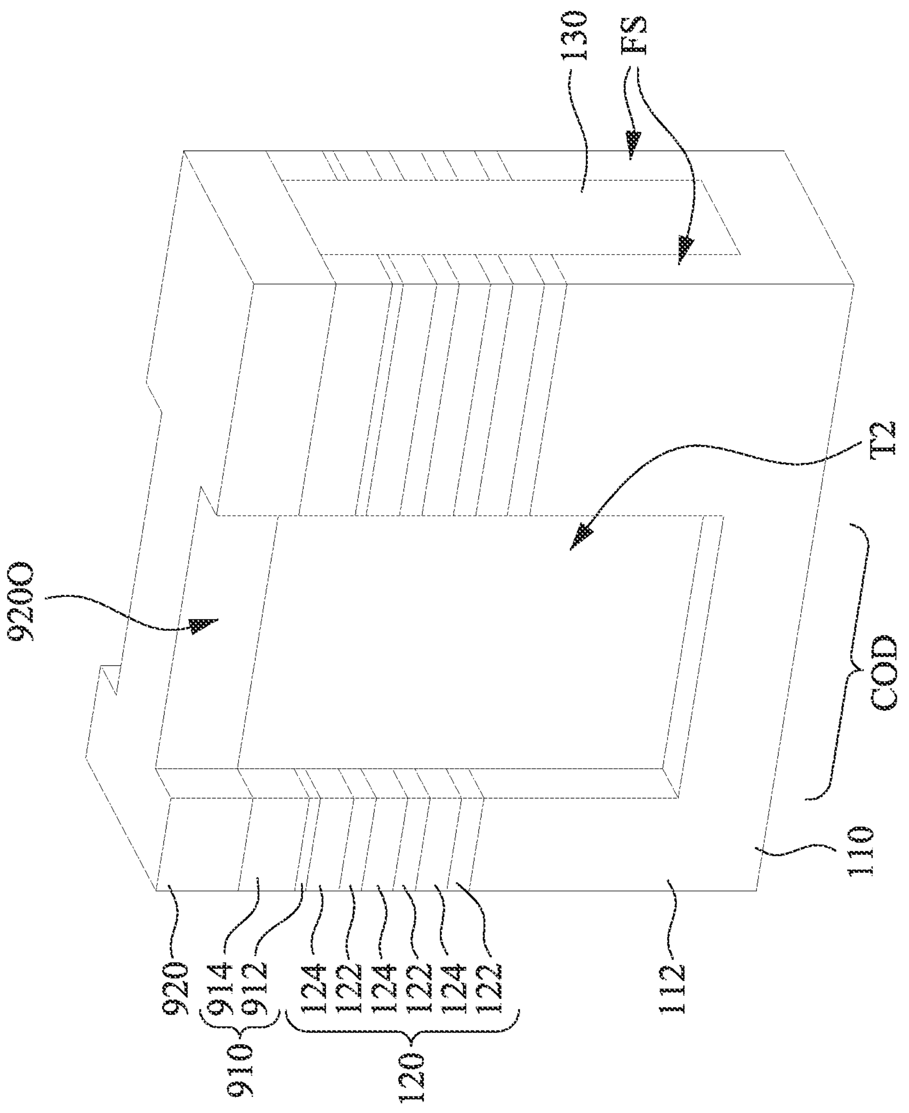

FIGS. 6A and 6B illustrate a top view and a perspective view of cutting the fins FS. The patterned mask layer 920 may be used to protect regions of the fins FS and layers formed thereupon, while an etching process forms trenches T2 in unprotected regions of the fins FS. The regions of the trenches T2 may be referred to as cut OD regions COD. For example, the trenches T2 extend through the HM layer 910, through the epitaxial stack 120, and into the substrate 110, thereby cutting one OD region (e.g., one fin FS in FIG. 5) into plural separated OD regions (e.g., plural separated fins FS). The trenches T2 may be etched using a dry etch (e.g., reactive ion etching), a wet etch, and/or combination thereof. In some embodiments, the fin cutting process may be self-alignment cut OD fin process using the isolation structure 130 as an etch hard mask. For example, during cutting the fins FS, the isolation structure 130 may have a higher etch resistance to the etching process than that of the fins FS, and the isolation structure 130 may limit the profile of the trenches T2. A bottom of the resulted trenches T2 may be lowered than the top surface of the isolation structure 130.

Figure 7A:
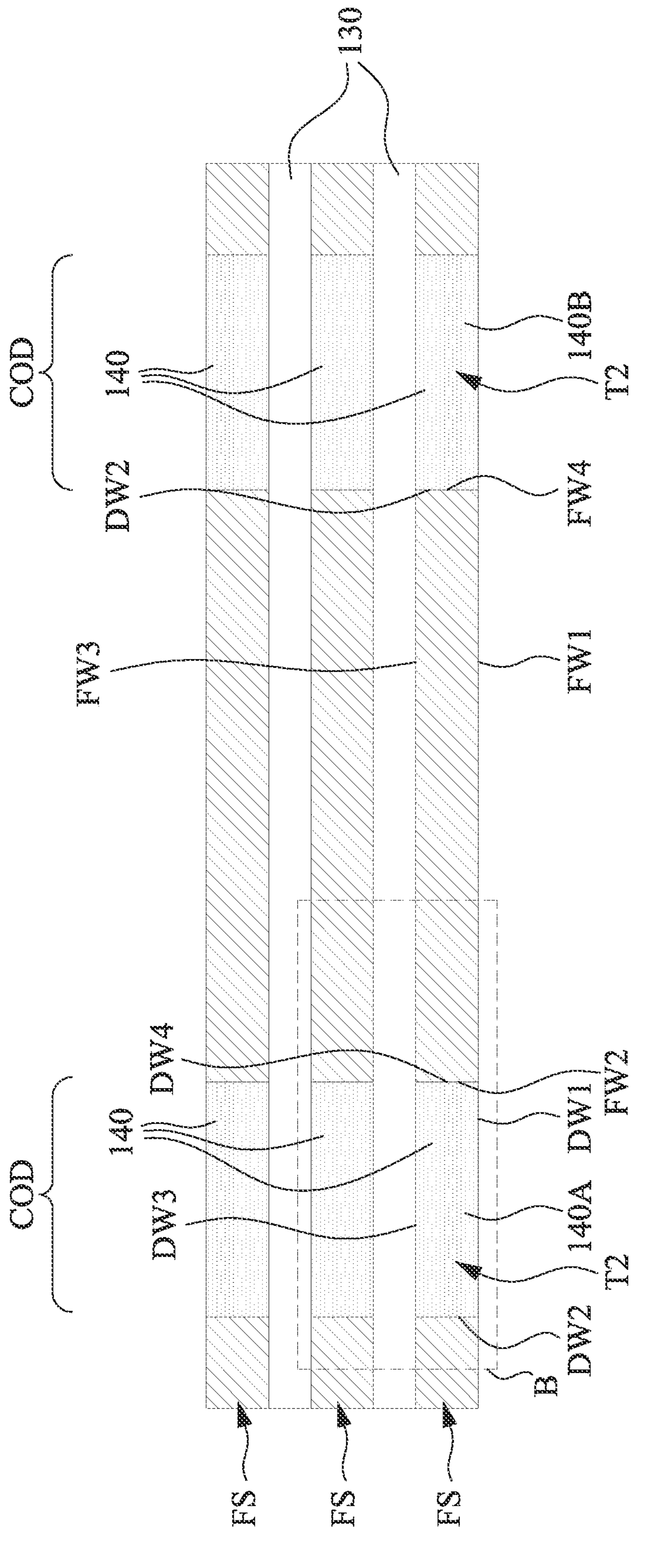
Figure 7B:
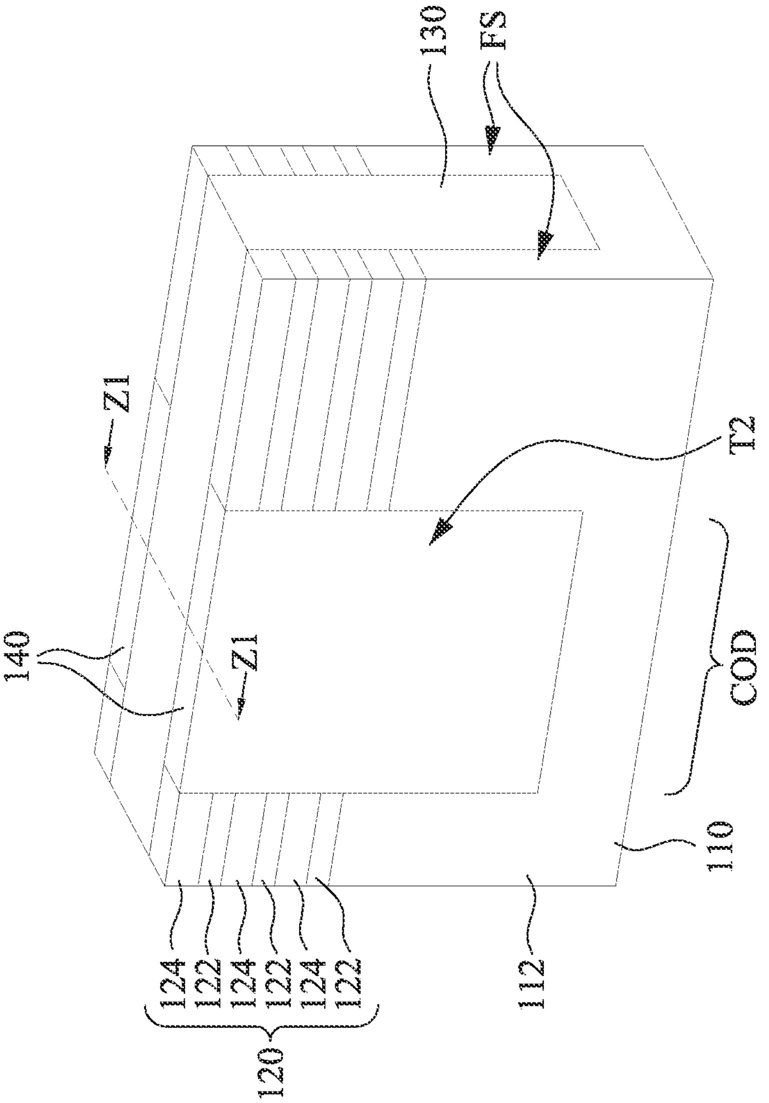

FIGS. 7A and 7B illustrate a top view and a perspective view of formation of dielectric fin structures 140. The dielectric fin structures 140 may also be referred to as dielectric fins or isolation structures in the context. By way of example and not limitation, a dielectric layer is first deposited over the substrate 110, filling the trenches T2 with the dielectric material. In some embodiments, the dielectric layer may include SiOCN, SiON, oxide, $Si_3N_4$, the like, or the combinations thereof. In various examples, the dielectric layer may be deposited by a CVD process, a subatmospheric CVD (SACVD) process, a flowable CVD process, an ALD process, a physical vapor deposition (PVD) process, and/or other suitable processes. In some embodiments, the dielectric layer (and subsequently formed dielectric fin structure 140) may include a multi-layer structure, for example, having one or more liner layers. After the deposition of the dielectric layer, the deposited dielectric material may be thinned and planarized, for example by a chemical mechanical polishing (CMP) process. In some embodiments, the CMP process planarizes the top surface of the dielectric fin structure 140, the top surface of the fin FS, and the top surface of the isolation structure 130. For example, after the CMP process is completed, the top surface of the dielectric fin structure 140 may be substantially coplanar with a top surface of the topmost epitaxial layer 124 and the top surface of the isolation structure 130. The top surface of the dielectric fin structure 140 may be higher than a top surface of a bottommost one of the first and second semiconductor layers 122 and 124. In some embodiments, the dielectric fin structures 140 has a dielectric material different from that of the isolation structure 130, thereby serving as an etch mask during subsequent isolation recessing process. In some embodiments, a dielectric material of the dielectric fin structures 140 may be different from that of the nitride mask layer 914. For example, the dielectric fin structures 140 may include SiOCN, the nitride mask layer 914 includes $Si_3N_4$, and the isolation structure 130 includes $SiO_2$.

Through the steps, the dielectric fin structure 140 extends substantially along a direction that the fin FS extends along and substantially aligned to the fin FS. As shown in FIG. 7A, the fin FS may have sidewalls FW1-FW4, the sidewalls FW1 and FW3 are longer than the sidewalls FW2 and FW4, and each of the sidewalls FW1 and FW3 connect the sidewall FW2 to the sidewall FW4. Similarly, the dielectric fin structures 140 may have sidewalls DW1-DW4, the opposite sidewalls DW1 and DW3 are longer than the opposite sidewalls DW2 and DW4, and each of the sidewalls DW1 and DW3 connect the sidewall DW2 to the sidewall DW4. As shown in the present embodiments, the isolation structure 130 is at the sidewalls FW1 and FW3 of the fin FS and at the sidewalls DW1 and DW3 of the dielectric fin structure 140, the dielectric fin structures 140 (labeled as dielectric fin structures 140A and 140B) are respectively at sidewalls FW2 and FW4 of the fin FS. For example, the sidewall FW2 of the fin FS is in contact with the sidewall DW4 of the dielectric fin structure 140A, and the sidewall FW4 of the fin FS is in contact with the sidewall DW2 of the dielectric fin structure 140B.

Figure 8A:
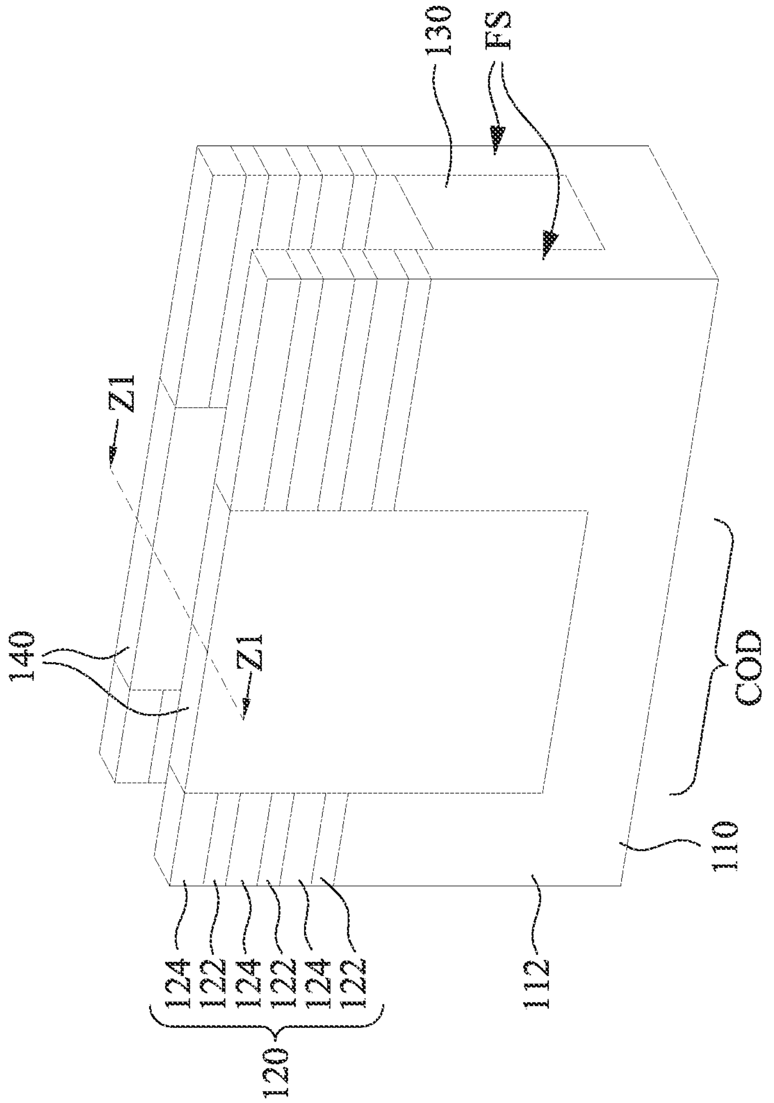
Figure 8B:
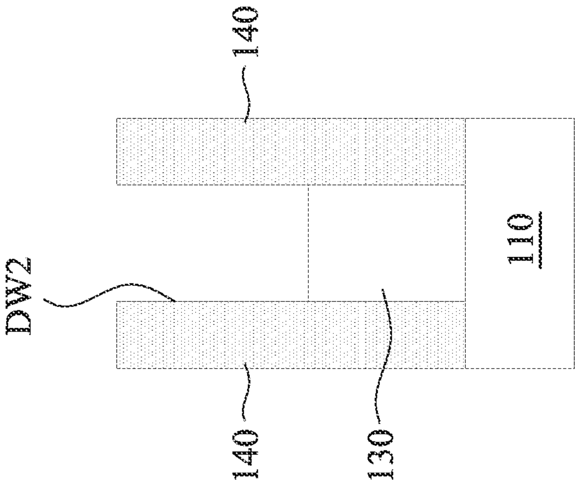

FIGS. 8A and 8B illustrate a perspective view and a cross-sectional view of the recessing of the isolation structure 130. The isolation structure 130 is recessed by an etch back process, thereby providing the fins FS and the dielectric fin structure 140 having exposed sidewalls extending above the etched back isolation structure 130. As shown in the figures, a top surface of the dielectric fin structure 140 may be higher than a top surface of the isolation structure 130. The etch back process may show etch selectivity between the isolation structure 130 and the dielectric fin structure 140. For example, the etch process etches the isolation structure 130 at a faster rate than the etch process etches the dielectric fin structure 140. Thus, the dielectric fin structure 140 may not be substantially damaged during the etch back process. In some embodiments, the recessing process may include a dry etching process, a wet etching process, and/or a combination thereof. A recessing depth may be controlled (e.g., by controlling an etching time) so as to result in a target height of the exposed upper portion of the fins FS. In the illustrated embodiments, the target height exposes each of the epitaxial layers 122 and 124 of the epitaxial stack 120 in the fins FS.

FIGS. 9A-9D illustrate a top view, a perspective view, and cross-sectional views of formation of gate structures DG. In some embodiments, the gate structures DG are dummy (sacrificial) gate structures that are subsequently removed. Thus, in some embodiments using a gate-last process, the gate structures DG are dummy gate structures and will be replaced by the final gate structures at a subsequent processing stage of the integrated circuit device. In particular, the dummy gate structures DG may be replaced at a later processing stage by a high-k dielectric layer (HK) and metal gate electrode (MG) as discussed below. In some embodiments, the dummy gate structures DG are formed over the substrate 110 and are at least partially disposed over the fins FS. The portion of the fins FS underlying the dummy gate structures DG may be referred to as the channel region. The dummy gate structures DG may also define a source/drain (S/D) region of the fins FS, for example, the regions of the fin FS adjacent and on opposing sides of the channel region.

In the illustrated embodiments, the formation of the gate structures DG first forms a dummy gate dielectric layer 150 over the fins FS. In some embodiments, the dummy gate dielectric layer 150 may include $SiO_2$, silicon nitride, a high-k dielectric material and/or other suitable material. In various examples, the dummy gate dielectric layer 150 may be deposited by a CVD process, a subatmospheric CVD (SACVD) process, a flowable CVD process, an ALD process, a PVD process, or other suitable process. By way of example, the dummy gate dielectric layer 150 may be used to prevent damages to the fins FS by subsequent processes (e.g., subsequent formation of the dummy gate structure). Subsequently, the formation of the gate structures DG forms a dummy gate electrode layer 160 and a hard mask 170 which may include multiple layers (e.g., a nitride layer 172 and an oxide layer 174).

In some embodiments, the dummy gate structure DG is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 160 may include polycrystalline silicon (polysilicon). In some embodiments, the hard mask 170 includes a nitride layer 172 such as $Si_3N_4$ and/or silicon oxynitride and an oxide layer 174 such as $SiO_2$. In some embodiments, after patterning the dummy gate electrode layer 160, the dummy gate dielectric layer 150 is removed from the S/D regions of the fins FS. The etch process may include a wet etch, a dry etch, and/or a combination thereof. The etch process is chosen to selectively etch the dummy gate dielectric layer 150 without substantially etching the fins FS, the dummy gate electrode layer 160, and the hard mask 170.

Through the steps, some of the dummy gate structure DG are formed across the dielectric fin structures 140, and some of the dummy gate structure DG are formed across the semiconductor fins FS. For clear illustration, the dummy gate structures DG are labelled as dummy gate structures DG1-DG4. The dummy gate structure DG2 may extend across the dielectric fin structures 140 and be in contact with the sidewalls DW1 and DW3 of the dielectric fin structures 140. The dummy gate structure DG4 may extend across the semiconductor fins FS and be in contact with the sidewalls FW1 and FW3 of the semiconductor fins FS. The dummy gate structures DG1 and DG3 may be disposed over a boundary between the semiconductor fins FS and the dielectric fin structures 140. Thus, the dummy gate structures DG1 and DG3 may extend across the dielectric fin structures 140 and the semiconductor fins FS, and be contact with the sidewalls FW1 and FW3 of the semiconductor fins FS and the sidewalls DW1 and DW3 of the dielectric fin structures 140.

In absence of the dielectric fin structures 140, the dummy gate structure DG2, which is stands away from the fins FS, may extend to a position below the top of the fins FS in the cut OD regions COD. The configuration of the dummy gate structure DG2 may suffer high risk of poly line collapse in the following process due to its high aspect ratio. A high-k/metal gate structure that subsequently replaces the dummy gate structure DG2 may have defect issues due to the poly line collapse.

In some embodiments of the present disclosure, with the configuration of the dielectric fin structures 140, the dummy gate structure DG2 may not extend to a position below the top of the fins FS in the cut OD regions COD. Thus, a height of the dummy gate structure DG2 in the cut OD regions COD is reduced. Through the configuration, the dielectric fin structures 140 can reduce the aspect ratio of the dummy gate structure DG2 and provide a strong base supporting the poly line, thereby avoiding the poly line collapse. Through the configuration, the defect issues of the high-k/metal gate structure due to the poly line collapse may be addressed.

Figure 10A:
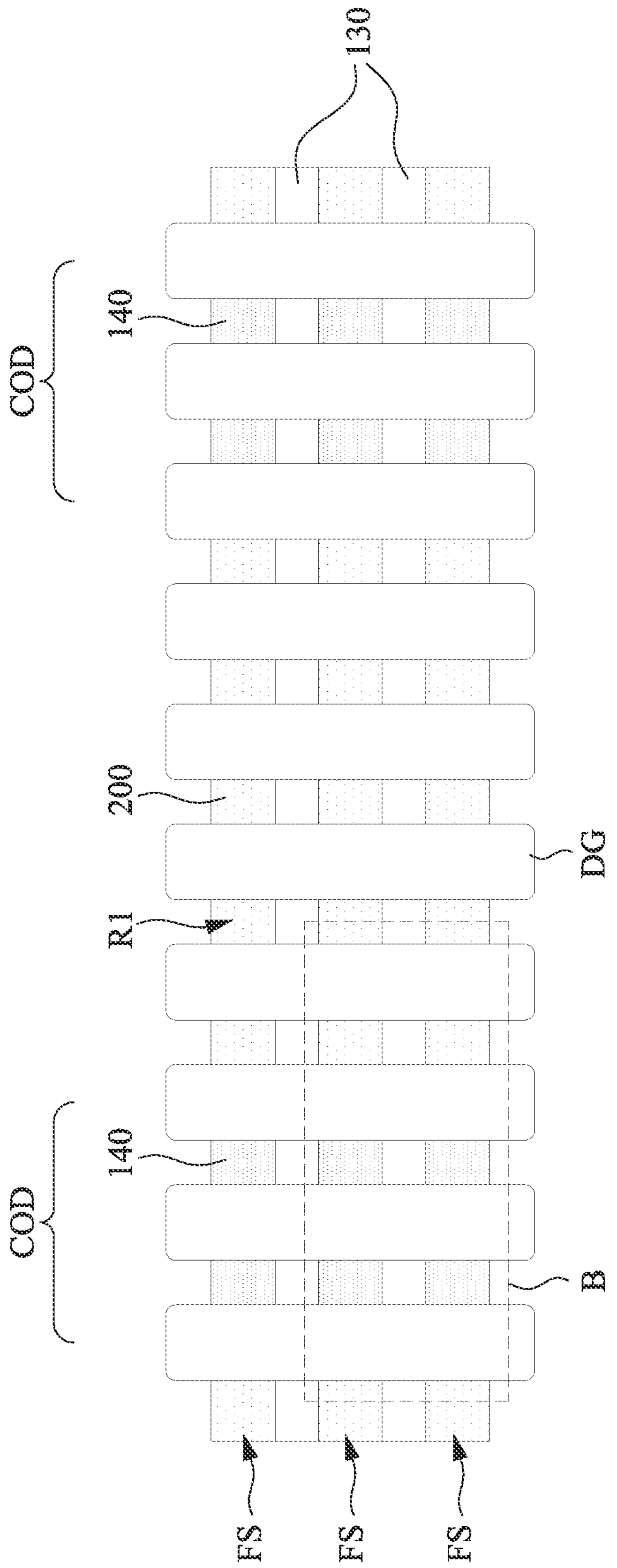
Figure 10B:
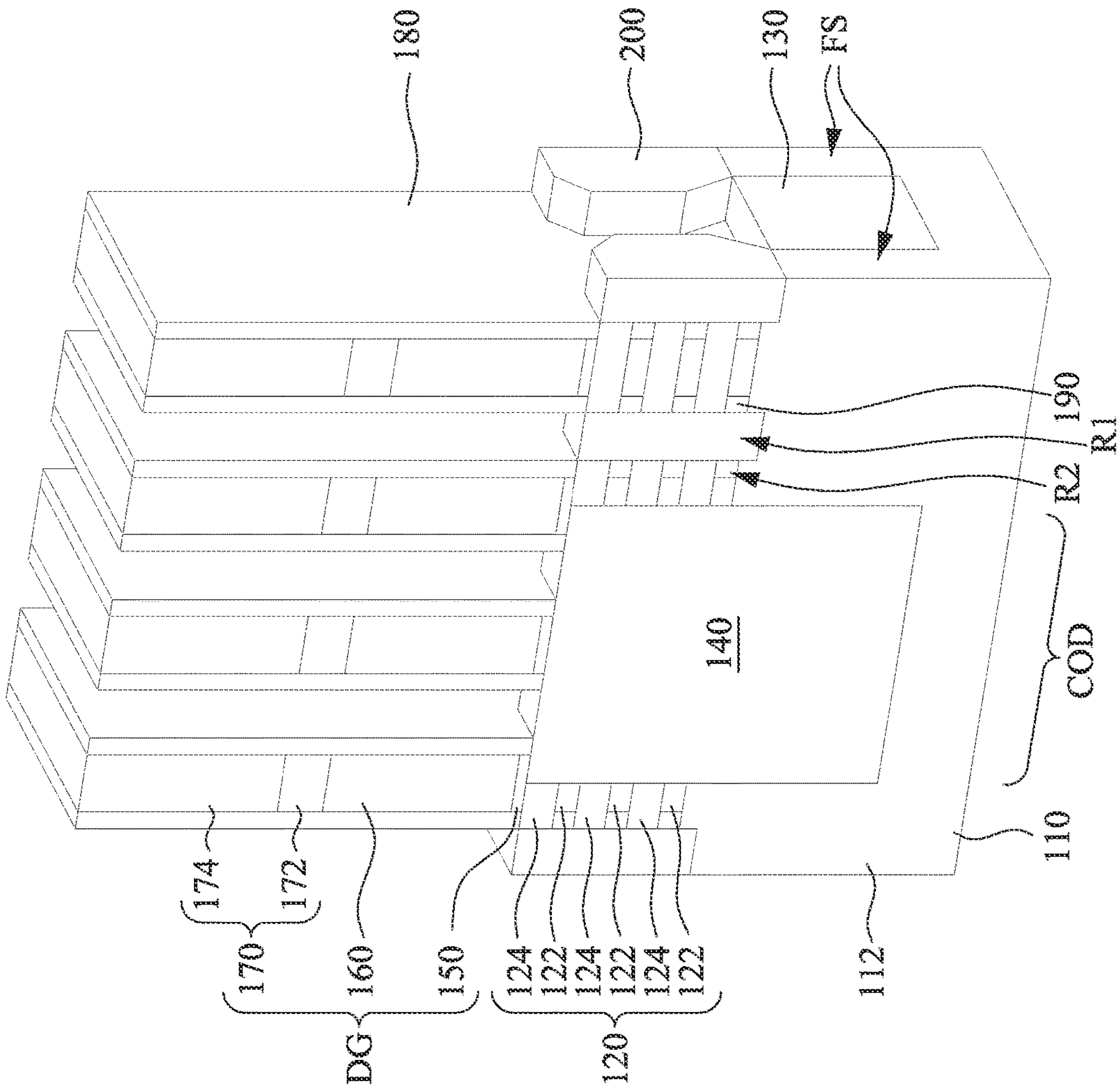
Figure 11A:
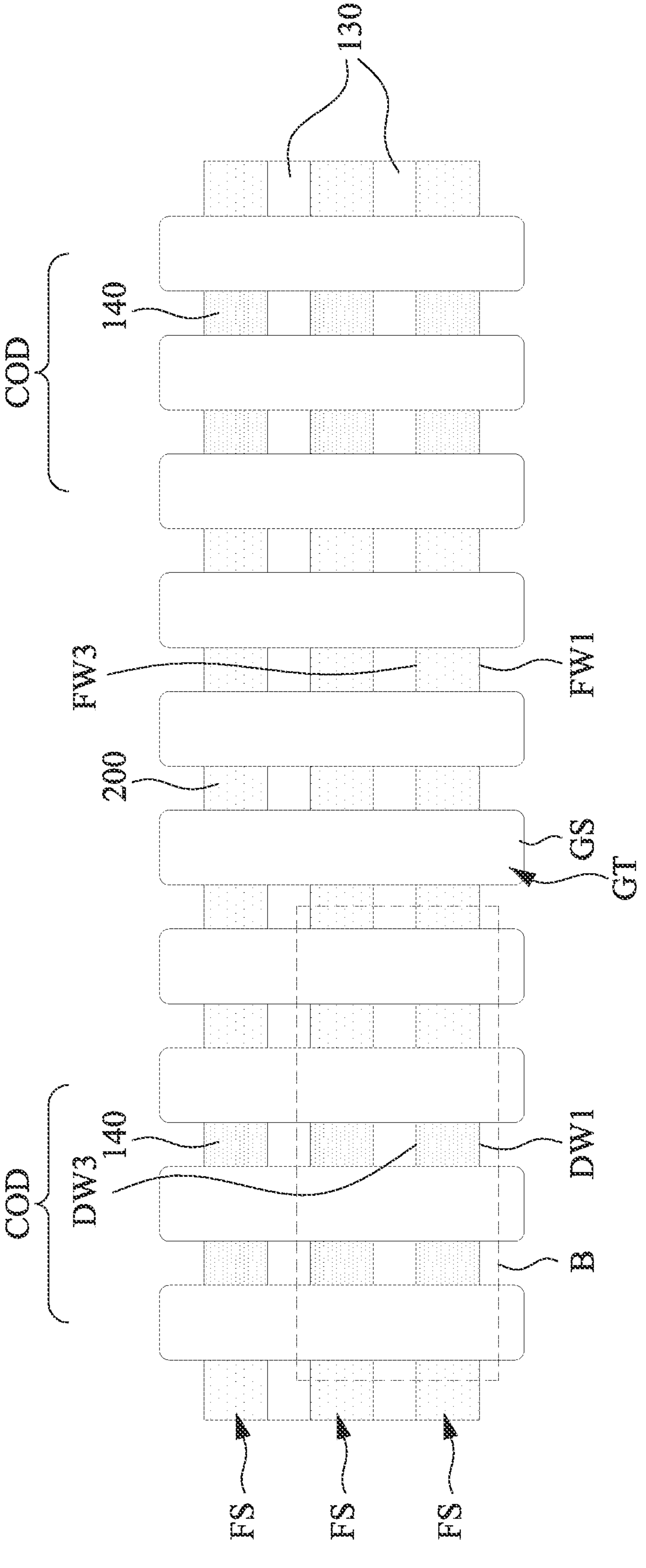
Figure 11B:
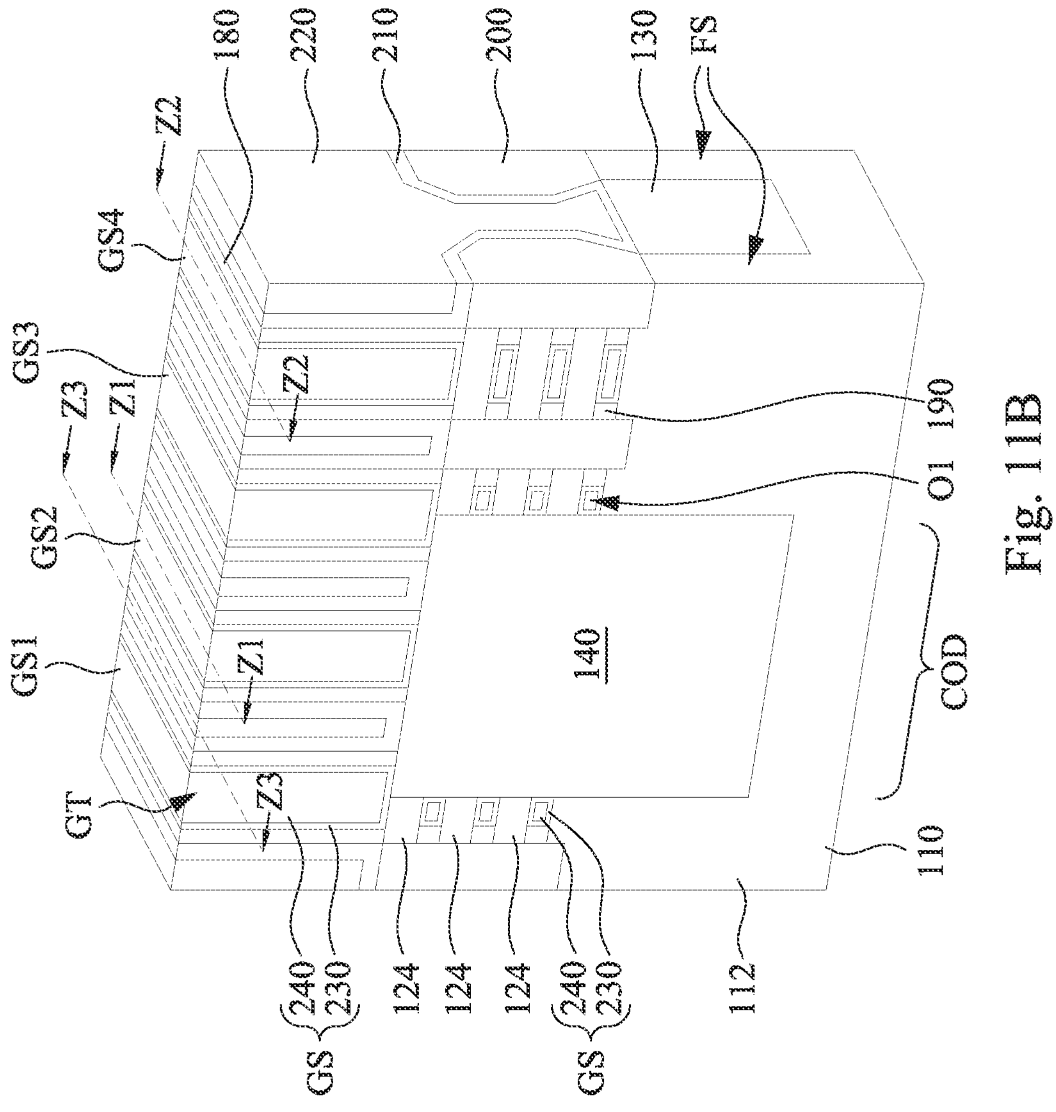
Figure 11D:
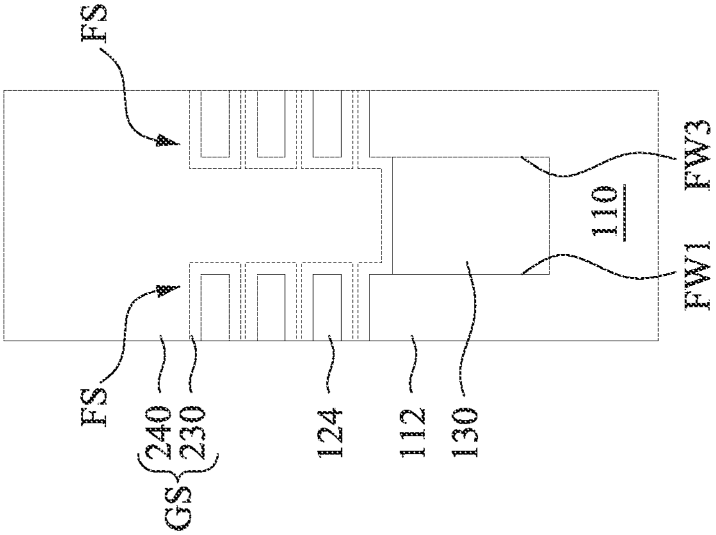
Figure 11C:
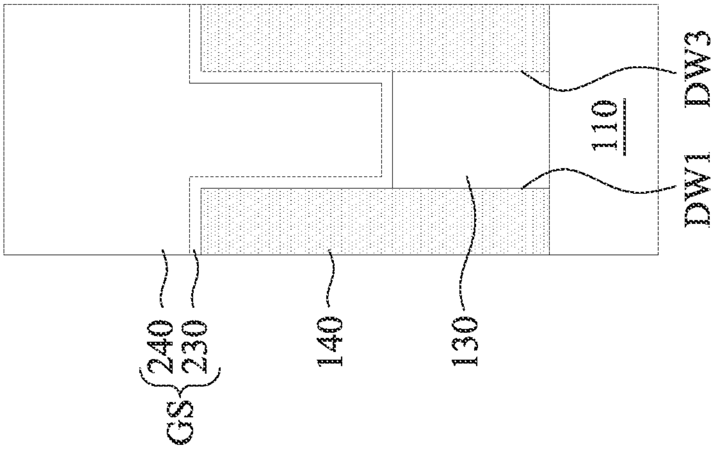
Figure 11E:
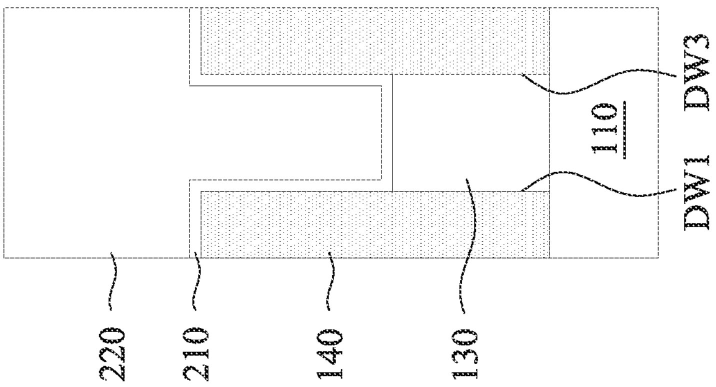

FIGS. 10A and 10B illustrate a top view and a perspective view of formation of gate spacers 180, inner spacers 190, and source/drain epitaxial structures 200. After the formation of the dummy gate structures DG, gate spacers 180 are formed on sidewalls of the dummy gate structures DG. For example, a spacer material layer is conformally deposited on the substrate using processes such as, CVD process, a subatmospheric CVD (SACVD) process, a flowable CVD process, an ALD process, a PVD process, or other suitable process. The spacer material layer may include a dielectric material such as silicon oxide, silicon nitride, silicon carbide, silicon oxynitride, SiCN films, silicon oxycarbide, SiOCN films, and/or combinations thereof. The spacer material layer is subsequently etched back to form the gate spacers 180. For example, an anisotropic etching process is performed on the deposited spacer material layer to expose portions of the fins FS not covered by the dummy gate structures DG (e.g., in source/drain regions of the fins FS). Portions of the spacer material layer directly above the dummy gate structures DG may be completely removed by this anisotropic etching process. Portions of the spacer material layer on sidewalls of the dummy gate structures DG may remain, forming gate sidewall spacers, which are denoted as the gate spacers 180, for the sake of simplicity. In some embodiments, the spacer material layer includes multiple layers, and therefore the gate spacers 180 may be multi-layer structures.

Figure 9A:
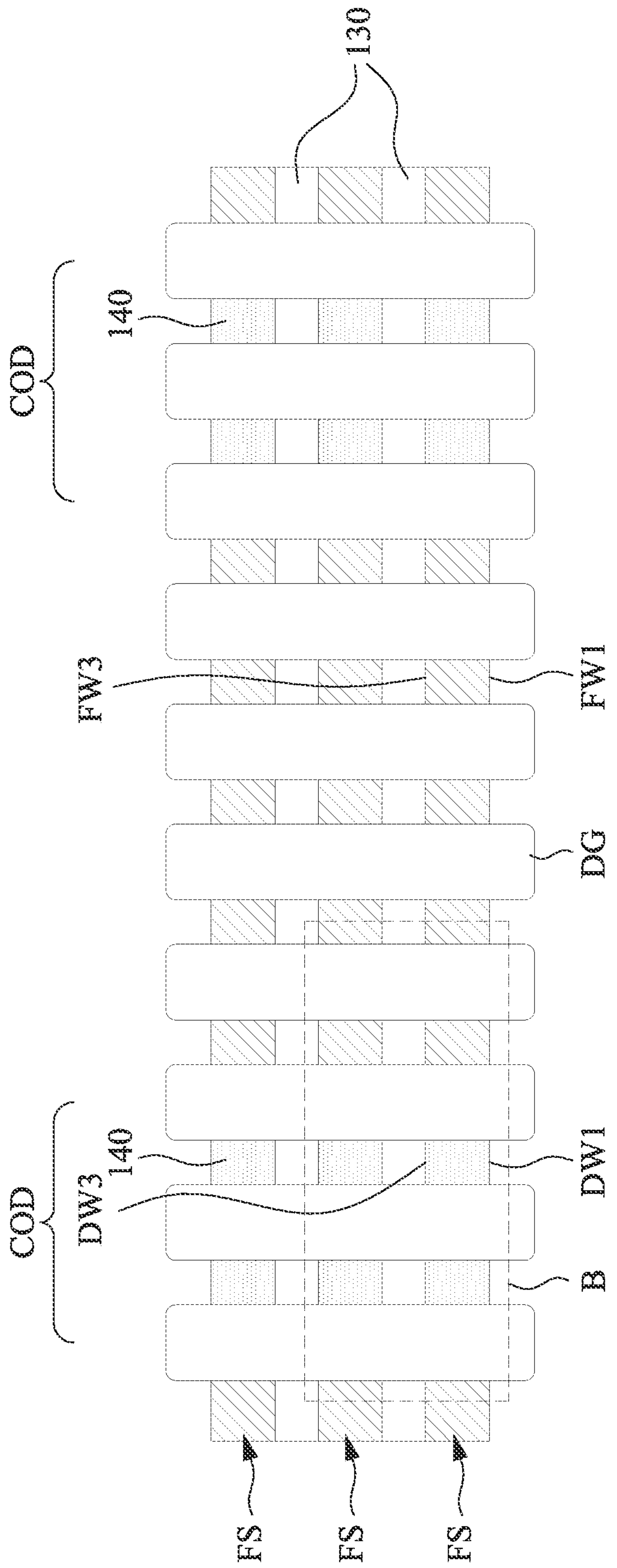
Figure 9B:
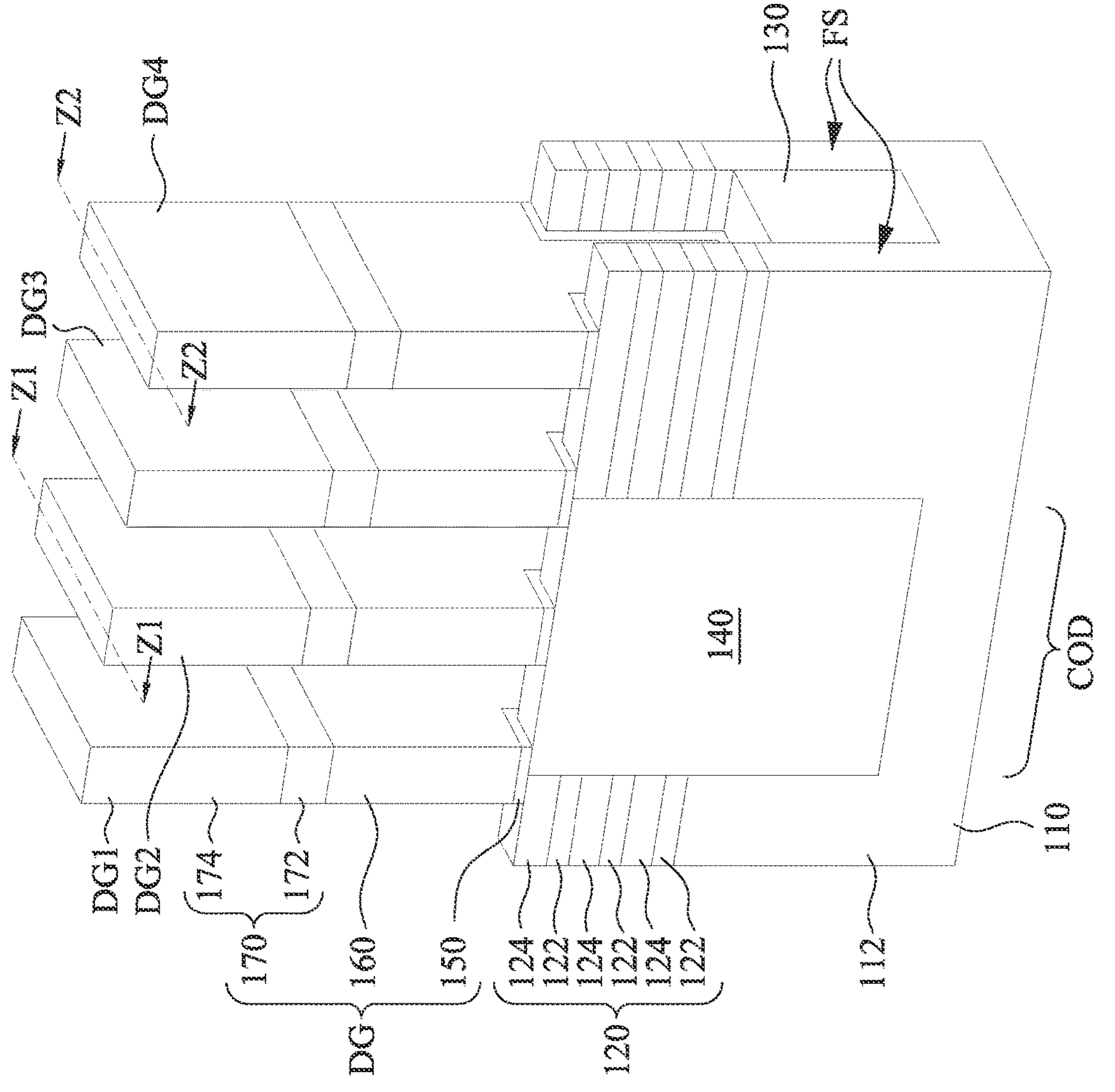
Figure 9C:
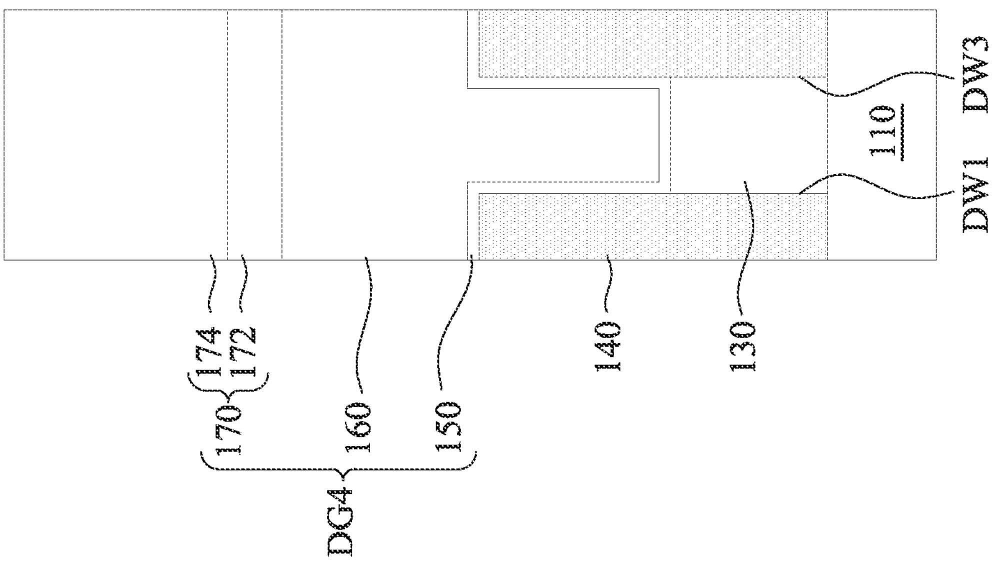
Figure 9D:
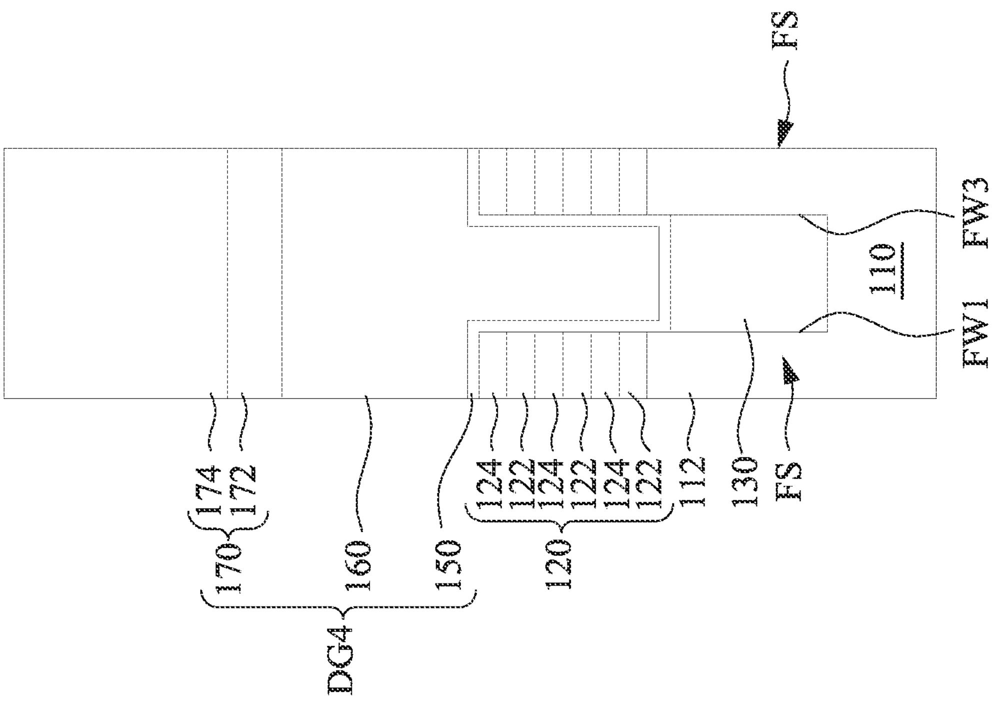

With reference to FIGS. 9B and 10B, portions of the semiconductor fins FS that extend laterally beyond the gate spacers 180 (e.g., in source/drain regions of the fins FS) are etched by using, for example, an anisotropic etching process that uses the dummy gate structures DG, the gate spacers 180, and the dielectric fin structure 140 as an etch mask, resulting in recesses R1 into the fins FS and between corresponding dummy gate structures DG. After the anisotropic etching, end surfaces of the sacrificial layers 122 and channel layers 124 are substantially aligned with respective outermost sidewalls of the gate spacers 180, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof. In some embodiments, the dielectric fin structure 140 and the isolation structure 130 may have a higher etch resistance to the anisotropic etching process than that of the semiconductor fins FS, and thus not substantially etched.

Next, referring to FIG. 10B, the sacrificial layers 122 are laterally or horizontally recessed by using suitable etch techniques, resulting in lateral recesses R2 each vertically between corresponding channel layers 124. This step may be performed by using a selective etching process. By way of example and not limitation, the sacrificial layers 122 are SiGe and the channel layers 124 are silicon allowing for the selective etching of the sacrificial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 remain substantially intact during laterally recessing the sacrificial layers 122. As a result, the channel layers 124 laterally extend past opposite end surfaces of the sacrificial layers 122.

After the sacrificial layers 122 have been laterally recessed, an inner spacer material is formed to fill the recesses R2 left by the lateral etching of the sacrificial layers 122. The inner spacer material may be a low-k dielectric material (with dielectric constant lower than about 7), such as $SiO_2$, SiN, SiCN, or SiOCN, the like, or the combination thereof. In some embodiments, the inner spacer material may include the same dielectric material as that of the dielectric fin structures 140, such as SiOCN. The inner spacer material may be formed by a suitable deposition method, such as ALD. After the deposition of the inner spacer material, an anisotropic etching process may be performed to trim the deposited inner spacer material, such that only portions of the deposited inner spacer material that fill the recesses R2 left by the lateral etching of the sacrificial layers 122 are left. After the trimming process, the remaining portions of the deposited inner spacer material are denoted as inner spacers 190, for the sake of simplicity. The inner spacers 190 serve to isolate metal gates from source/drain epitaxial structures formed in subsequent processing. In the example of FIG. 10B, sidewalls of the inner spacers 190 may be vertically aligned with sidewalls of the channel layers 124. In some other embodiments, sidewalls of the inner spacers 240 are laterally set back from sidewalls of the channel layers 124.

After the formation of the inner spacers 190, source/drain epitaxial structures 200 are formed in the recesses R1 in the fins FS. The source/drain epitaxial structures 200 may be formed by performing an epitaxial growth process that provides an epitaxial material on the fins FS. During the epitaxial growth process, the dummy gate structures DG and gate spacers 180 limit the source/drain epitaxial structures 200 to the source/drain regions in the fins FS. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the substrate 110 and the channel layers 124.

In some embodiments, the source/drain epitaxial structures 200 may include Ge, Si, GaAs, AlGaAs, SiGe, GaAsP, SiP, or other suitable material. The source/drain epitaxial structures 200 may be in-situ doped during the epitaxial process by introducing doping species including: p-type dopants, such as boron; n-type dopants, such as phosphorus or arsenic; and/or other suitable dopants including combinations thereof. If the source/drain epitaxial structures 200 are not in-situ doped, an implantation process (i.e., a junction implant process) is performed to dope the source/drain epitaxial structures 200. In some exemplary embodiments, the source/drain epitaxial structures 200 in an NFET device include SiP, while those in a PFET device include GeSnB and/or SiGeSnB.

FIGS. 11A-11E illustrate a top view, a perspective view, and cross-sectional views of formation of a contact etch stop layer (CESL) 210, an interlayer dielectric (ILD) layer 220, and replacement gate structures GS.

The CESL 210 may be deposited over the structure of FIG. 9B. In some examples, the CESL 210 includes a silicon nitride layer, silicon oxide layer, a silicon oxynitride layer, and/or other suitable materials. The CESL 210 may be formed by plasma-enhanced chemical vapor deposition (PECVD) process and/or other suitable deposition or oxidation processes. The ILD layer 220 is then deposited over the CESL 210. In some embodiments, the ILD layer 220 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 210. The ILD layer 220 may be deposited by a PECVD process or other suitable deposition technique. In some embodiments, after formation of the ILD layer 220, the integrated circuit device may be subject to a high thermal budget process to anneal the ILD layer 220.

After depositing the ILD layer 220, a planarization process may be performed to remove excessive materials of the CESL 210 and the ILD layer 220. For example, a planarization process includes a chemical mechanical planarization (CMP) process which removes portions of the ILD layer 220 and the CESL 210 overlying the dummy gate structures DG and planarizes a top surface of the integrated circuit device. In some embodiments, the CMP process also removes the layers 172, 174 in the dummy gate structures DG (as shown in FIG. 10B) and exposes the dummy gate electrode layer 160.

Next, the dummy gate structures DG are removed, followed by removing the sacrificial layers 122. In the illustrated embodiments, the dummy gate structures DG are removed by using a selective etching process (e.g., selective dry etching, selective wet etching, or a combination thereof) that etches the materials in dummy gate structures DG at a faster etch rate than it etches other materials (e.g., gate spacers 180, CESL 210 and/or ILD layer 220), thus resulting in gate trenches GT between corresponding gate spacers 180, with the sacrificial layers 122 (referring to FIG. 10B) exposed in the gate trenches GT. Subsequently, the sacrificial layers 122 in the gate trenches GT are etched by using another selective etching process that etches the sacrificial layers 122 at a faster etch rate than it etches the channel layers 124, thus forming openings O1 between neighboring channel layers 124. In this way, the channel layers 124 become nanosheets suspended over the substrate 110 and between the source/drain epitaxial structures 200. This step is also called a channel release process. At this interim processing step, the openings O1 between nanosheets 124 may be filled with ambient environment conditions (e.g., air, nitrogen, etc). In some embodiments, the nanosheets 124 can be interchangeably referred to as nanowires, nanoslabs and nanorings, depending on their geometry. For example, in some other embodiments the channel layers 124 may be trimmed to have a substantial rounded shape (i.e., cylindrical) due to the selective etching process for completely removing the sacrificial layers 122. In that case, the resultant channel layers 124 can be called nanowires.

In some embodiments, the sacrificial layers 122 are removed by using a selective wet etching process. In some embodiments, the sacrificial layers 122 are SiGe and the channel layers 124 are silicon allowing for the selective removal of the sacrificial layers 122. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 may remain substantially intact during the channel release process. In some embodiments, both the channel release step and the previous step of laterally recessing sacrificial layers use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

The replacement gate structures GS are respectively formed in the gate trenches GT to surround each of the nanosheets 124 suspended in the gate trenches GT. The gate structures GS may be final gates of GAA FETs. The final gate structure may be a high-k/metal gate stack, however other compositions are possible. In some embodiments, each of the gate structures GS forms the gate associated with the multi-channels provided by the plurality of nanosheets 124. For example, high-k/metal gate structures GS are formed within the openings O1 provided by the release of nanosheets 124. In various embodiments, the high-k/metal gate structure GS includes a gate dielectric layer 230 formed around the nanosheets 124, and a gate metal layer 240 formed around the gate dielectric layer 230 and filling a remainder of gate trenches GT. Formation of the high-k/metal gate structures GS may include one or more deposition processes to form various gate materials, followed by a CMP processes to remove excessive gate materials, resulting in the high-k/metal gate structures GS having top surfaces level with a top surface of the ILD layer 220. As illustrated in the cross-sectional view of FIG. 11B, the high-k/metal gate structure GS surrounds each of the nanosheets 124, and thus is referred to as a gate of a GAA FET.

The gate dielectric layer 230 may include an interfacial layer and a high k dielectric layer over the interfacial layer. In some embodiments, the interfacial layer is silicon oxide formed on exposed surfaces of semiconductor materials in the gate trenches GT by using, for example, thermal oxidation, chemical oxidation, wet oxidation or the like. As a result, surface portions of the nanosheets 124 and the semiconductor substrate 110 exposed in the gate trenches GT are oxidized into silicon oxide to form the interfacial layer. In some embodiments, the high-k gate dielectric layer includes dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), the like, or combinations thereof.

In some embodiments, the gate metal layer 240 includes one or more metal layers. For example, the gate metal layer 240 may include one or more work function metal layers stacked one over another and a fill metal filling up a remainder of gate trenches GT. The one or more work function metal layers in the gate metal layer 240 provide a suitable work function for the high-k/metal gate structures GS. For an n-type GAA FET, the gate metal layer 240 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the gate metal layer 240 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 240 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Through the steps, some of the high-k/metal gate structure GS are formed across the dielectric fin structures 140, and some of the high-k/metal gate structure GS are formed across the semiconductor fins FS. For clear illustration, the high-k/metal gate structures GS are labelled as gate structures GS1-GS4, each of the gate structures GS1-GS4 includes the gate dielectric layer 230 and the gate metal layer 240. The gate structure GS2 may extend across the dielectric fin structures 140 and be in contact with the sidewalls DW1 and DW3 of the dielectric fin structures 140. The gate structure GS4 may extend across the semiconductor fins FS and be in contact with the sidewalls FW1 and FW3 of the semiconductor fins FS (e.g., the nanosheets 124 and/or the portion 112). The gate structure GS4 may wrap around the semiconductor nanostructures (e.g., the nanosheets 124). The gate structures GS1 and GS3 may be disposed over a boundary between the semiconductor fins FS and the dielectric fin structures 140. Thus, the gate structures GS1 and GS3 may extend across the dielectric fin structures 140 and the semiconductor fins FS, and be contact with the sidewalls FW1 and FW3 of the semiconductor fins FS (e.g., the nanosheets 124 and/or the portion 112), and the sidewalls DW1 and DW3 of the dielectric fin structures 140. In some embodiments, the high-k/metal gate structures GS1-GS3 may be referred to as dummy high-k/metal gate structure. In some embodiments, the source/drain epitaxial structures 200 are formed between the gates structures GS3 and GS4, no source/drain epitaxial structures is formed between the gates structures GS1 and GS2, and no source/drain epitaxial structures is formed between the gates structures GS2 and GS3.

In absence of the dielectric fin structures 140, the gate structures GS1 and GS3, which are disposed over a boundary between the semiconductor fins FS and the dielectric fin structures 140, may be formed in a small space in the cut OD regions COD at a position below the top of the fins FS. Thus, defects may occur due to small critical dimension of the high-k/metal gate structure.

In some embodiments of the present disclosure, with the configuration of the dielectric fin structures 140, the gate structures GS1 and GS3 may not be formed in the cut OD regions COD at a position below the top of the fins FS. Thus, no defect occurs due to small critical dimension of the high-k/metal gate structure.

In some embodiments of the present disclosure, with the configuration of the dielectric fin structures 140, a portion of the gate structures GS1-GS3 over the dielectric fin structures 140 has a height less than a height of a portion of the gate structures GS1-GS over the isolation structure 130. The gate structures GS1-GS3 may not extend to a position below the top of the fins FS in the cut OD regions COD, and thus no metal features is observed at a position below the top of the fins FS in the cut OD region COD.

Figure 12:
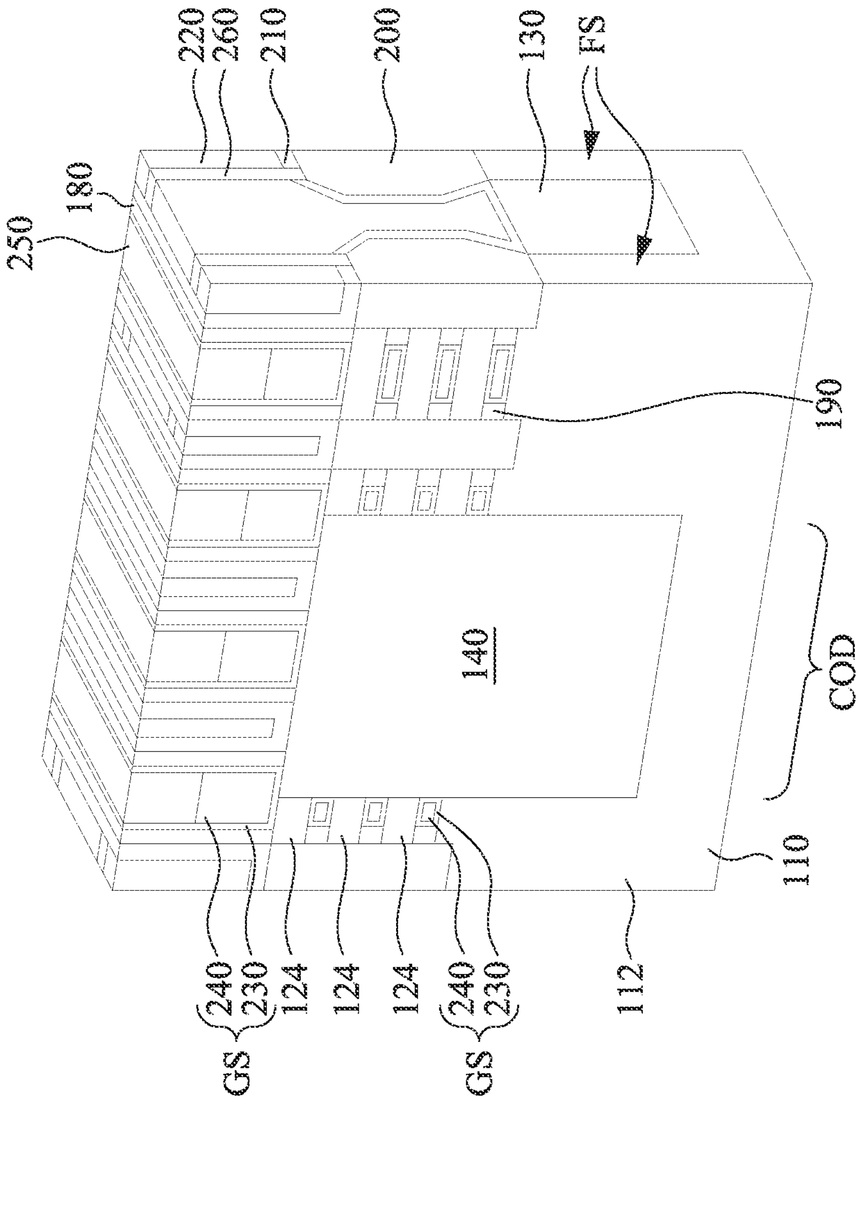

FIG. 12 illustrate a perspective view of formation of source/drain contacts 260 over the source/drain epitaxial structures 200. In some embodiments, source/drain contact holes are first formed through the ILD layer 220 and CESL 210 to expose the source/drain epitaxial structures 200 by using suitable photolithography and etching techniques. Silicide regions (not shown) may be formed on the exposed surfaces of the source/drain epitaxial structures 200 by using a silicidation process. The source/drain contacts 260 may be formed by depositing one or more metal materials (e.g., tungsten, cobalt, copper, the like or combinations thereof) to fill the contact holes by using suitable deposition techniques (e.g., CVD, PVD, ALD, the like or combinations thereof), followed by a CMP process to remove excess metal materials outside the contact openings.

In some embodiments, a protection layer 250 is formed over the high-k/metal gate structures GS prior to the formation of source/drain contacts 260. The protection layer 250 can be referred to as a mask layer in some embodiments. The protection layer 250 may provide protection for the high-k/metal gate structures GS in the process of etching the contact holes by protecting high-k/metal gate structures GS during removing the ILD layer 220. The protection layer 250 may include silicon nitride, silicon carbide, silicon oxynitride, and/or other suitable material. In some embodiments, the protection layer 250 includes a material which is different from the gate spacer 180 and the ILD layer 220. For example, the protection layer 250 includes silicon nitride while the gate spacers 180 and the ILD layer 220 include silicon oxide. The protection layer 250 may be deposited by CVD, ALD, and/or other proper technique. A CMP may be performed to polish back the protection layer 250 and hereby provide a substantially planar top surface of the protection layer 250 with respect to the ILD layer 220 and the gate spacers 180.

Based on the above discussions, it can be seen that the present disclosure offers advantages over GAA devices. It is understood, however, that other embodiments may offer additional advantages, and not all advantages are necessarily disclosed herein, and that no particular advantage is required for all embodiments. One advantage is that a dielectric fin is disposed at cut OD region, the dielectric fin structures can reduce the aspect ratio of the dummy gate structure and provide a strong base supporting the poly line, thereby avoiding the poly line collapse. Another advantage is that with the configuration of the dielectric fin, the gate structures across the OD region and the cut OD region may not extend to a position below the top of the fins, and thus no defect occurs due to small critical dimension of the high-k/metal gate structure. Still another advantage is that no metal features is observed at a position below the top of the fins FS in the cut OD region. Still another advantage is that the fin can be cut by a self-align process using isolation features as hard mask.

According to some embodiments of the present disclosure, a method for manufacturing an integrated circuit device is provided. The method includes forming a semiconductor fin over a semiconductor substrate; forming an isolation structure surrounding the semiconductor fin; etching a trench in the semiconductor fin; forming a dielectric fin in the trench; after forming the dielectric fin, recessing a top surface of the isolation structure, such that the dielectric fin and the semiconductor fin protrude from the recessed top surface of the isolation structure; and forming a first metal gate structure and a second metal gate structure over the dielectric fin and the semiconductor fin, respectively.

According to some embodiments of the present disclosure, a method for manufacturing an integrated circuit device is provided. The method includes depositing an epitaxial stack over a semiconductor substrate, wherein the epitaxial stack comprises a plurality of first and second semiconductor layers alternately arranged over the semiconductor substrate; patterning the epitaxial stack and the semiconductor substrate to form a semiconductor fin; removing a first portion of the semiconductor fin, wherein a second portion of the semiconductor fin is remained; forming a dielectric fin adjacent to the second portion of the semiconductor fin, wherein the dielectric fin extends substantially along a same direction that the semiconductor fin extends along; and forming a first metal gate structure and a second metal gate structure over the dielectric fin and the semiconductor fin, respectively.

According to some embodiments of the present disclosure, an integrated circuit device is provided. The integrated circuit device includes a semiconductor fin extending along a first direction; an isolation structure laterally surrounding the semiconductor fin; a dielectric fin extending substantially along the first direction and substantially aligned with the semiconductor fin from a top view, wherein from a cross-sectional view the dielectric fin has a top surface higher than a top surface of the isolation structure; and a first gate structure extending across the dielectric fin along a second direction different from the first direction from the top view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an integrated circuit device, comprising:
- forming a semiconductor fin over a semiconductor substrate, wherein the semiconductor fin comprises a plurality of first and second semiconductor layers alternately arranged over the semiconductor substrate;
- forming an isolation structure surrounding the semiconductor fin;
- etching a trench in the semiconductor fin;
- forming a dielectric fin in the trench, wherein a bottom surface of the dielectric fin is level with a bottom surface of the isolation structure, and the dielectric fin has a first sidewall in contact with the isolation structure and a second sidewall in contact with the semiconductor fin;
- after forming the dielectric fin, recessing a top surface of the isolation structure, such that the dielectric fin and the semiconductor fin protrude from the recessed top surface of the isolation structure;
- recessing the first semiconductor layers to form recesses between the second semiconductor layers;
- forming inner spacers in the recesses;
- removing the recessed first semiconductor layers to suspend the second semiconductor layers;
- forming a first metal gate structure and a second metal gate structure across the semiconductor fin and the dielectric fin, respectively, wherein a portion of a gate metal layer of the second metal gate structure is on the second sidewall of the dielectric fin; and
- forming a third metal gate structure across a boundary between the dielectric fin and the semiconductor fin and surrounding the second semiconductor layers, wherein a portion of a gate metal layer of the third metal gate structure is sandwiched between the dielectric fin and one of the inner spacers.

2. The method of claim 1, wherein etching the trench in the semiconductor fin is performed such that the trench exposes a sidewall of the isolation structure.

3. The method of claim 1, wherein etching the trench is performed such that a bottom of the trench is lower than the top surface of the isolation structure.

4. The method of claim 1, wherein forming the dielectric fin comprises:
- filling the trench with a dielectric material; and
- planarizing a top surface of the dielectric material with the top surface of the semiconductor fin.

5. The method of claim 4, wherein planarizing the top surface of the dielectric material is performed such that the top surface of the dielectric fin, the top surface of the semiconductor fin, and the top surface of the isolation structure are planarized.

6. The method of claim 1, wherein the dielectric fin comprises a material different from that of the isolation structure.

7. The method of claim 1, wherein the dielectric fin comprises SiOCN.

8. The method of claim 1, wherein forming the isolation structure is performed such that the isolation structure is in contact with a third sidewall of the semiconductor fin, and etching the trench is performed such that a fourth sidewall of the semiconductor fin is exposed, and the third sidewall of the semiconductor fin is longer than the fourth sidewall of the semiconductor fin from a top view.

9. The method of claim 8, wherein forming the dielectric fin is performed such that the dielectric fin is in contact with the fourth sidewall of the semiconductor fin.

10. A method for manufacturing an integrated circuit device, comprising:

depositing an epitaxial stack over a semiconductor substrate, wherein the epitaxial stack comprises a plurality of first and second semiconductor layers alternately arranged over the semiconductor substrate;

patterning the epitaxial stack and the semiconductor substrate to form a semiconductor fin;

forming an isolation structure surrounding the semiconductor fin;

removing a first portion of the semiconductor fin, wherein a second portion of the semiconductor fin is remained;

forming a dielectric fin adjacent to the second portion of the semiconductor fin, wherein the dielectric fin extends substantially along a same direction that the semiconductor fin extends along;

recessing a top surface of the isolation structure, such that a portion of the dielectric fin protruding from the recessed isolation structure has a vertical thickness in a direction from a bottom surface of the dielectric fin toward a top surface of the dielectric fin greater than a vertical thickness of the epitaxial stack of the second portion of the semiconductor fin in the direction;

recessing the first semiconductor layers to form recesses between the second semiconductor layers;

forming inner spacers in the recesses;

removing the recessed first semiconductor layers to suspend the second semiconductor layers; and forming a first metal gate structure across a boundary between the dielectric fin and the semiconductor fin and surrounding the second semiconductor layers, wherein a portion of a gate metal layer of the first metal gate structure is sandwiched between the dielectric fin and one of the inner spacers.

11. The method of claim 10, wherein removing the first portion of the semiconductor fin is performed such that a third portion of the semiconductor fin is remained, and the dielectric fin extends from the second portion of the semiconductor fin to the third portion of the semiconductor fin.

12. The method of claim 10, wherein forming the dielectric fin is performed such that the top surface of the dielectric fin is higher than a top surface of a bottommost one of the first and second semiconductor layers.

13. The method of claim 10, further comprising:

forming a second metal gate structure over the dielectric fin.

14. The method of claim 10, further comprising:

forming a third metal gate structure over the semiconductor fin.

15. A method for manufacturing an integrated circuit device, comprising:

forming a semiconductor structure over a substrate, wherein the semiconductor structure comprises a plurality of first and second semiconductor layers alternately arranged over the substrate;

forming a first dielectric isolation structure over the substrate and laterally surrounding the semiconductor structure;

patterning the semiconductor structure to form a trench in the semiconductor structure, wherein the trench exposes the first dielectric isolation structure;

forming a second dielectric isolation structure in the trench and in contact with the first dielectric isolation structure, wherein a first sidewall of the second dielectric isolation structure is in contact with the semiconductor structure;

etching the first dielectric isolation structure to expose a second sidewall of the second dielectric isolation structure after forming the second dielectric isolation structure;

recessing the first semiconductor layers to form recesses between the second semiconductor layers;

forming inner spacers in the recesses;

removing the recessed first semiconductor layers to suspend the second semiconductor layers; and forming a metal gate structure across the semiconductor structure and the second dielectric isolation structure, wherein a portion of a gate metal layer of the metal gate structure is on the first sidewall of the second dielectric isolation structure and is sandwiched between the second dielectric isolation structure and one of the inner spacers.

16. The method of claim 15, wherein the metal gate structure is in contact with the first sidewall and the second sidewall of the second dielectric isolation structure.

17. The method of claim 15, wherein the first dielectric isolation structure and the second dielectric isolation structure have different materials.

18. The method of claim 15, wherein a first portion of the metal gate structure stands on the semiconductor structure, a second portion of the metal gate structure stands on the second dielectric isolation structure, and a third portion of the metal gate structure stands on the first dielectric isolation structure.

19. The method of claim 15, wherein a width of the second dielectric isolation structure is substantially the same as a width of the semiconductor structure.

20. The method of claim 15, wherein a bottom surface of the second dielectric isolation structure is coplanar with a bottom surface of the first dielectric isolation structure.

* * * * *